United States Patent [19]
Cox

[11] Patent Number: 5,453,742
[45] Date of Patent: Sep. 26, 1995

[54] HIGH DENSITY DATA COMPRESSION ENCODE/DECODE CIRCUIT APPARATUS AND METHOD OF USING IN LOCAL AREA NETWORKS

[76] Inventor: David F. Cox, 180 N. Harrison Rd., Tucson, Ariz. 85748

[21] Appl. No.: 137,486

[22] Filed: Oct. 18, 1993

[51] Int. Cl.$^6$ .................................................. H03M 5/02
[52] U.S. Cl. .............................................. 341/64; 375/239
[58] Field of Search ............................ 341/64, 118, 119, 341/120, 121; 375/23

[56] References Cited

U.S. PATENT DOCUMENTS

| | | | |
|---|---|---|---|
| 3,510,780 | 5/1970 | Buehrle | 325/321 |
| 3,633,190 | 1/1972 | Morsing et al. | 340/174.1 |
| 3,641,525 | 2/1972 | Milligan | 340/174.1 |
| 3,646,534 | 2/1972 | Miller | 340/174.1 |
| 4,462,051 | 7/1984 | Chan | 360/44 |
| 4,562,490 | 12/1985 | Barth et al. | 360/44 |
| 4,954,825 | 9/1990 | Chi | 341/64 |
| 5,165,089 | 11/1992 | Jaquette et al. | 369/59 |
| 5,216,302 | 7/1993 | Tanizawa | 307/603 |

*Primary Examiner*—Brian K. Young
*Attorney, Agent, or Firm*—Victor Flores

[57] ABSTRACT

Data compression encoding and decoding circuitry which eliminates the need for decode circuitry that looks for the flux reversal points, or peaks, namely the peak detector and the phase-lock-loop circuitry combination. The encoding circuitry manipulates data by encoding data in a pulse position modulation (PPM) format such that ONE's (1's) in a data stream are delayed a first predetermined time period from the prior flux reversal (transition), and the ZERO's (0's) in the data stream are delayed a predetermined second time period from the previous transition. The encoder includes timing delay calibration circuitry that controls the time difference between transitions representing ONE's and ZERO's. The timing difference being controlled by a phase-lock loop (PLL)/precision crystal oscillator circuit combination that provides a reference delay for use by ASIC delay elements. The reference delay essentially calibrates a plurality of ASIC delay elements for encoding and facilitate subsequent decoding of corresponding calibrated delay measurement of the data bits in the decoder. The decoder member includes a plurality of delay elements that are controlled by a similar PLL delay control circuit combination that facilitates placing a data bit into its proper decode value. The encoding and decoding circuitry facilitates a 200 MBPS data rate system which is usable in local area network (LAN) systems and further facilitates data throughput as high as 98%.

16 Claims, 2 Drawing Sheets

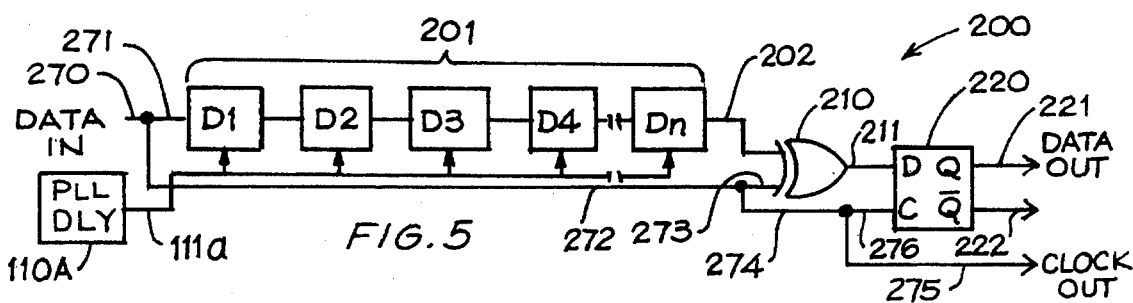
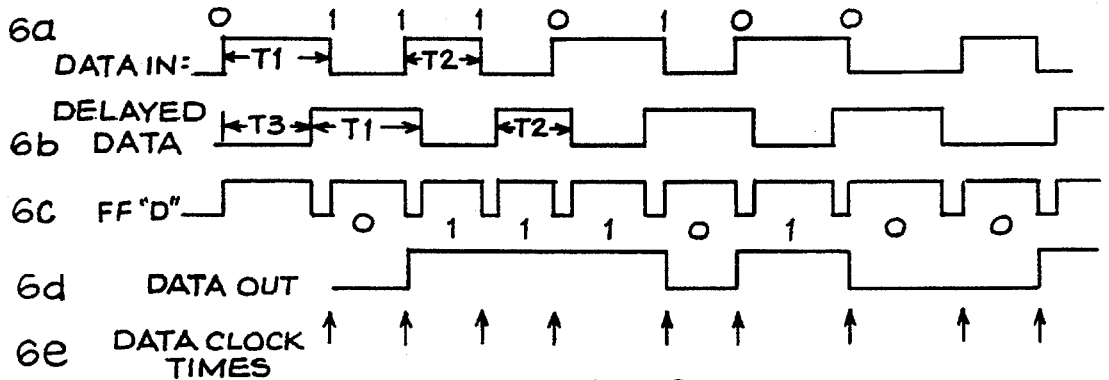
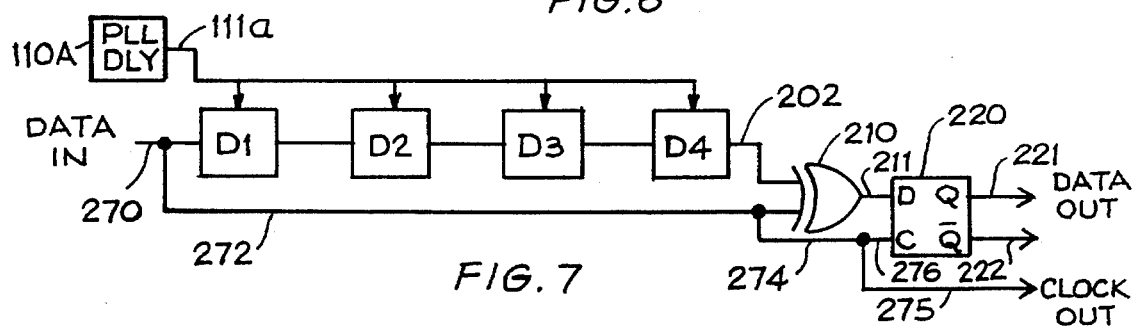
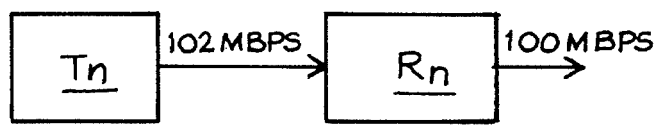

HIGH DENSITY DATA COMPRESSION ENCODE/DECODE CIRCUIT APPARATUS AND METHOD OF USING IN LOCAL AREA NETWORKS

FIELD OF THE INVENTION

The present invention relates to data recording circuits. More particularly, the present invention relates to codes and associated electronic circuitry used for writing data to, and reading data from, disk drives, tape drives, and the like. Even more particularly, the present invention relates to encoding schemes and associated data encoding and decoding circuitry that facilitates the compression of data to achieve resolutions of less than sixty percent (60%) during recovery of the data.

BACKGROUND OF THE INVENTION

The prior art teaches that information can be transmitted through an information channel by representing the information in terms of lapse time between two successive transitions between electrical states in the system, see U.S. Pat. No. 3,510,780. This type of encoding and decoding of information can be termed as a form of pulse position modulation, also referred to as PPM. In a binary system, as taught by the '780 patent, a first lapsed time, by example one millisecond, may represent a binary zero. A second and greater period of lapsed time, for example a one and one-half millisecond, may represent a binary one. The end of message, by example, being an elapsed time of two milliseconds. This type of scheme not only provides an indication of information, i.e. the binary state, but also provides self clocking information, and may utilize NRZI binary coding, (i.e. wherein a binary zero indicates no change in state, hence no information change, while a binary one indicates a change in state). A distinct advantage results during decoding of data encoded in the foregoing manner in that only pulse/clock generator circuit elements need be employed in the decode circuitry instead of the traditional pulse detector and phase-lock loop circuit elements that must be sensitive to intersymbol interference. Thus, since in a PPM coding scheme the transition delay determines the data value, the intersymbol interference that occurs using traditional peak detector/phase-lock loop circuitry is minimized.

The known encoding circuits and decoding circuits used to implement PPM code schemes, such as taught by U.S. Pat. No. 3,510,780, are limited by the use of encoding and decoding circuit designs that produce binary data transitions whose time delay difference between the ONE state and the ZERO state is 50% or greater.

Another measure of data transmission parameters which relates to data throughput concerns the data recovery resolution factor, i.e. the ratio between the amplitudes of the data signal's highest frequency component and the lowest frequency component. Presently known decoding systems have resolution factors that are above 60% on a normalized data signal amplitude versus frequency curve. The 60% resolution factor is viewed as a data compaction limitation, i.e. the higher the resolution factor, the lower the rate of data transmission. This data compaction limitation of presently known systems being a phenomena related to management of intersymbol interference and flux reversals on the recording medium that impact accurate data bit transition detection.

Thus, a need is seen to exist for a PPM encoding and decoding circuit arrangement which can not only encode and decode a PPM type of code scheme, but which can further produce a constant stream of data transitions having a percentage differences of less than 10% between the time delays which represent the different binary states, and hence which can reliably record and read data at resolution factors of less than sixty percent (60%).

A need is also seen for a data encoding and decoding circuit scheme which can facilitate recovery of data at rates of at least 200 mega/bits per second (MBPS), which rates are not presently achievable in encode and decode circuit schemes for use in local area network (also referred to as LAN) and disk drive computer applications.

SUMMARY OF THE INVENTION

Accordingly, the primary object of the present invention is to provide a PPM encoding and decoding circuit arrangement which can not only encode and decode a PPM type of code scheme, but which can also produce a constant stream of data transitions having a percentage difference of less than 10% between the time delays which represent the different binary states, and which can thereby reliably record and read data at resolutions of less than sixty percent (60%).

Another object of the present invention is to provide a data encoding and decoding circuit scheme which can facilitate recovery of data at rates of at least 200 mega/bits per second (MBPS) that are useful in local area network and disk drive computer applications.

The foregoing objects are accomplished by providing encoding circuitry which eliminates the need for decode circuitry that looks for the flux reversal points, or peaks, namely the peak detector and the phase-lock-loop circuitry combination. The encoding circuitry of the present invention manipulates data by initially encoding the data in a scheme termed "pulse position modulation". By example, binary data is coded in NRZI (non-return to zero, invert on ones), where the data stream contains ONE's (1's) that are delayed a first predetermined time period from the prior flux reversal (transition), and ZERO's (0's) that are delayed a predetermined second time period from the previous transition. A particular feature of the present invention includes timing control circuitry that controls the time difference between transitions representing ONE's and ZERO's. The timing difference being controlled by a phase-lock loop (PLL)/precision crystal oscillator circuit combination that provides a reference delay for use by LOGIC delay elements. By example, a first binary state can be represented by a first delay that is equal to the reference delay and a second binary state can be represented by a second delay that is equal to the first delay plus an incremental delay associated with the precision of the crystal oscillator and the selected delay element. The reference delay essentially calibrates a plurality of delay elements to facilitate decoding subsequent corresponding calibrated delay measurement of the data bits. The decoder member of the present invention also includes a plurality of delay elements that are controlled by a PLL delay control circuit combination that facilitates placing a data bit into its proper decode value. Thus, the encoding scheme produces a constant stream of transitions with a predetermined precision frequency of occurrence which, when read back, serve as a selfclock. The scheme facilitates the use of a pulse/clock generator to replace the peak detector/PLL circuitry to generate the data and clock signals to be sent by the decoder to a controller.

Therefore, to the accomplishments of the foregoing objects, the invention consists of the foregoing features hereinafter fully described and particularly pointed out in the claims, the accompanying drawings and the following disclosure describing in detail the invention, such drawings and disclosure illustrating but one of the various ways in which the invention may be practiced.

BRIEF DESCRIPTION OF THE DRAWINGS

FIG. 5 is a block circuit diagram representation of a decode circuit in accordance with the present invention including delay elements being precision controlled for placing a data bit into its proper decode value.

FIG. 6 is a timing diagram of decoding the binary signal previously encoded in FIG. 1.

FIG. 7 is a specific decoding circuit in accordance with the present invention where 0.5 nanosecond delay elements are controlled by a phase-lock loop and crystal oscillator circuit combination for achieving a 200 MBPS data rate usable in local area network systems.

FIGS. 8(a) and 8(b) are a transmission data throughput comparison for a 100 MBPS data rate system.

DESCRIPTION OF THE PREFERRED EMBODIMENT

Figure 1:
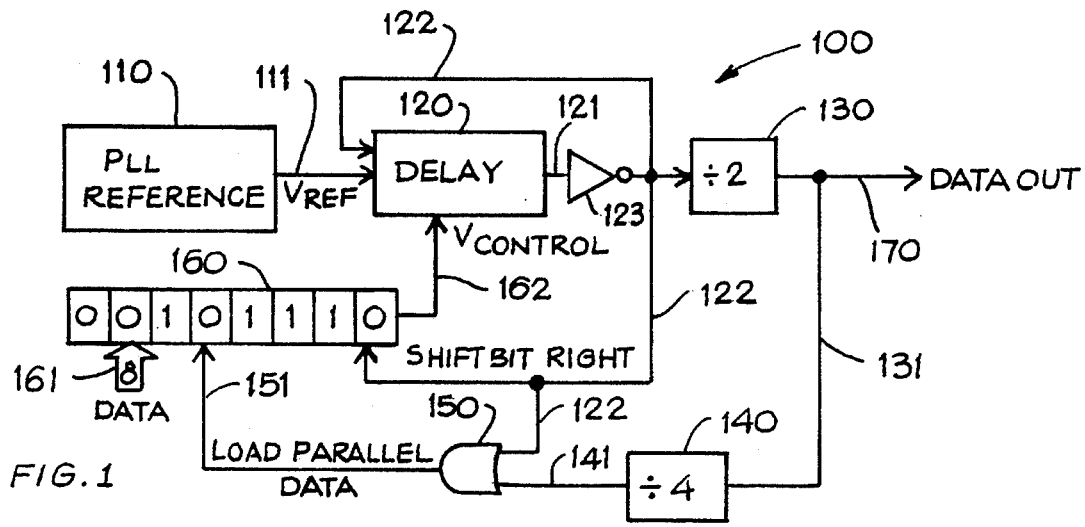
FIG. 1 is a block circuit diagram of an encode circuit provided with a PLL delay control in accordance with the present invention.
Figure 2:
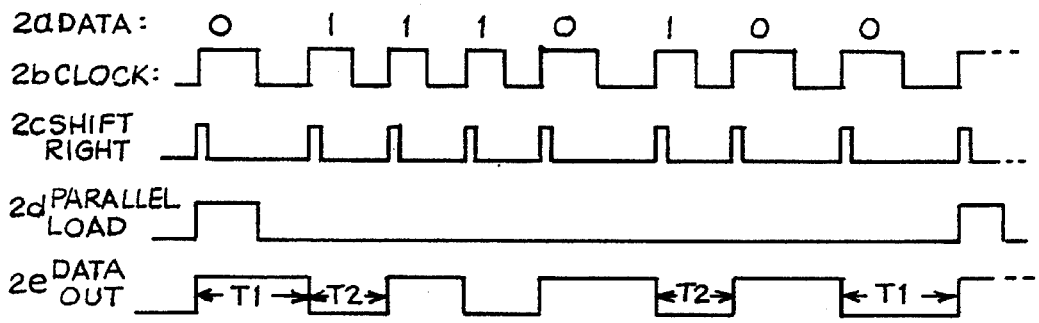
FIG. 2 consisting of (a)–(e) is a timing diagram of a binary signal encoded in accordance with the present invention.
Figure 3:
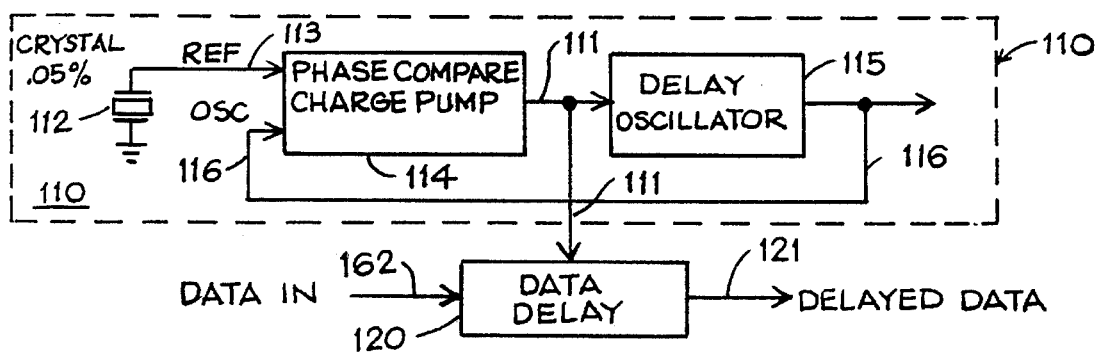
FIG. 3 is a block circuit diagram of the phase-lock loop and crystal oscillator circuit combination providing precision reference timing delay control for the delay circuit elements.

Referring now to FIG. 1 showing a block circuit diagram of an encode circuit 100 provided with a PLL delay control/calibration circuit portion 110 in accordance with the present invention. By example, in FIG. 1, the encode circuit 100 is provided with binary information in the form of an eight bit word 00101110, see FIG. 2(a), via an input 161 into shift register 160. The encoding scheme will be PPM in that the data is to be transmitted through an information channel 170 by representing the eight bit word in terms of lapse time T1 for ZEROS and T2 for ONES, see FIGS. 2(a) and (e). In addition to traditional PPM encoding scheme circuit elements, namely delay 120, invertor 123, divide-by-2 element 130, divide-by-4 element 140, AND gate 150, encode circuit 100 includes a PLL/precision crystal oscillator circuit 110 that facilitates encoding very small incremental time delay differences between transitions representing ONES and ZEROS. By example, a constant stream of data transitions having a percentage difference of less than 10% between the time delays T1 and T2 can be achieved. Since delay elements 120 are commercially available in the nanosecond range, the PLL/crystal oscillator control circuit 110 can be designed to provide incremental delay differences/calibrations between ONES and ZEROES as small as an individual delay element, i.e. by example, any one of delays D1–Dn shown in FIG. 5, or D1–D4 in FIG. 7, each having a 0.5 nanosecond delay value. By example, less than 10% delay difference between T1 and T2 may be achieved in a manner such that the ONES delay T2 is selected to be equal to the ZEROS delay T1, plus an incremental delay associated with the precision of the crystal oscillator alone, or to further include the delay of a delay element. In a 100 Mhz PLL, where a ZERO is delayed 4 nanoseconds and a ONE is delayed 5 nanoseconds, eleven half (0.5) nanosecond delay elements would be used in a manner such that a single 0.5 nanosecond delay element would allow encoding a ZERO= 3.5 Nsec< T1<4.5 Nsec and a ONE=4.5 Nsec< T2<5.5 Nsec. As shown in FIG. 1, delay control/calibration circuit 110 is activated by voltage control line 162 that sets delay block 120 to delay DATA OUT according to the predetermined reference delay of the phase-lock loop in circuit 110, clock line 122 (see also FIG. 2(b)), and according to whether the data bit is a ONE or a ZERO. For example, as shown in FIG. 2(e), a ZERO into VCO line 162 results in the PLL reference delay, via line 111, delaying DATA line 121 by time T1 that is longer than T2. DATA OUT line 170 is similarly delayed. In accordance with the present invention, delay T2 is preferably selected having the characteristic that the time delay difference between T2 and T1 is less than 10 percent, however, the actual delay difference is a factor of the delay characteristics of delay elements in the integrated circuit comprising a delay block and the precision of the crystal oscillator. As shown in FIG. 3, the PLL control circuit 110 effects precision incremental delay control by including a 0.05% precision crystal 112 for providing the reference input to the PLL comparator 114 via reference input 113. Delay oscillator 115 responds to positive or negative phase differences at output 111 by delivering the appropriate phase correcting output 116 to comparator 114. Delay block 120 can be controlled in accordance with the selected accuracy of crystal reference 112 and to be responsive to the ZERO and ONE data bit being Shifted out from shift register 160 and driving VCO line 162. The mechanics of encoding the entire data word is completed according to: (A) the process of parallel loading data bits into shift register 160, in accordance with a predetermined bit word loading format, see generally FIG. 2(d) and timing conditions at lines 122, 131 and 141 that sets line 151 to parallel load the data bits into shift register 160, (B) then shifting the data bits from register 160 according to shift bit right pulses 122 that occur on leading edges of the clock, see generally FIGS. 2(b) and (c), (C) setting a delay corresponding to the data bit shifted out from register 160 and in accordance with the delay calibration capabilities of the delay control circuit 110, (D) delaying DATA OUT according to the delay setting 162, and (E) repeating the encoding scheme for the remainder of the data bit in a word and other data words in the information stream.

Referring now to FIG. 5 where a block circuit diagram of a decode circuit 200 is depicted in accordance with the present invention. As shown, decode circuit 200 comprises a plurality of delay elements 201 (D1–Dn) that are precision controlled via delay control line 111a coming from PLL delay control circuit portion 110A (see generally FIG. 3) for placing a data bit into its proper decode value. Since DATA IN shown in FIG. 5 corresponds to DATA OUT from encode circuit portion 100, shown in FIG. 1, the data stream contains ONES and ZEROS binary data with transistions T1 and T2 according to the previously encoded information in accordance with the present invention. FIG. 6(a) depicts, by example, the same word 01110100 previously encoded. The diagram shows that the time between transitions determines the data value, while the transitions itself provide the CLOCK OUT, see FIG. 5. To place a data bit into its proper decode value, as best seen in FIGS. 5 and 6, DATA IN line 270 is processed by directing it via line 271 through delay block 201, to generate delayed data output 202 (see also FIG. 6(b), and directing it through EXCLUSIVE OR 210 via line 272 and line 273 to generate a pulsed clock output 211. DATA IN, via lines 272, 274 and 276 also provides a clock C input for D flip-flop 220, and further provides a CLOCK OUT, via line 275 as diagrammatically shown at FIG. 6(e). As seen in FIG. 6(b), DATA IN is delayed a time T3, as determined by the delay value of delay elements D1–Dn and the control provided by delay reference 111a, to generate delayed data output 202. The delayed data, via line 202, and DATA IN, via line 273, are processed through EXCLUSIVE OR 210 to generate pulsed output 211 that provides the D input to D flip-flop 220, see FIG. 6(c). The pulsed output 211, in combination with the DATA IN input, via line 276, to clock C input of D flip-flop 220, assures placement of a data bit into its proper decode value. Thus, as shown in FIG. 6(d), the Q output, line 221 DATA OUT to a controller (not shown), will be low and will remain low to reflect a 0 data bit at the end of T1 (associated with DATA IN), since the D input (clock pulse 211) was in a low state prior to the transition. At the end of the first 1 data bit in the data word, the state of the D input was high, thus the Q output will go high and will remain high for the next three pulses at output 211 to thus reflect the three 1 data bits in the data word. The Q output will remain high until switched low due to the pulsed output 211 being low at the end of the second 0 data bit in the data word. The D flip-flop will similarly respond to the remaining data bits to yield the properly decoded word 01110100 and any subsequent binary coded information. The not-Q, line 222, output is 10001011 concurrently. It should be appreciated that the pulsed output 211 is responsive to the amount of delay produced by delay block 201 and the control provided by PLL delay control circuit portion 110/110A both during the PPM encoding with T1 and T2 delays for ONES and ZEROS distinction and PPM decoding with T3 data delay.

FIG. 7 is a specific decoding circuit in accordance with the present invention where the delay elements D1–D4, controlled by PLL delay calibration circuit 110A are provided in 0.5 nanosecond timing increments for achieving T3=2 nanosecond and where data bits are PPM encoded in the 5 Nsec range, by example a ZERO=3.5 Nsec< T1<4.5 Nsec and a ONE=4.5 Nsec< T2<5.5 Nsec, to achieve a 200 MBPS data rate at output 221, which is usable in local area network systems (not shown). The operation of the 200 MBPS system may be understood by substituting T1=4 Nsec, T2=5 Nsec and T3=2 Nsec in each of the exemplary encoding and decoding diagrams.

FIG. 8(a–b) is a transmission data throughput comparison for prior art and present invention 100 MBPS data rate systems. FIG. 8(a) shows the performance of prior art decoding circuits here typically the system's encoding and decoding schemes require circuitry overhead, typically 25% overhead, resulting in reduced data throughput, or in a 100 MBPS prior art transmitter data rate system (To), requiring 125 MBPS being transmitted to yield 80% data bit throughput through receiver Ro, to achieve the desired 100 MBPS data rate. In contrast, FIG. 8(b) shows that by using the encoding and decoding scheme of the present invention, the encoding and decoding circuitry overhead is substantially smaller, typically 2%, resulting in transmitting only 102 MBPS from present invention transmitter Tn to achieve 98% throughput through present invention receiver Rn to achieve the same 100 MBPS data rate.

Figure 4:
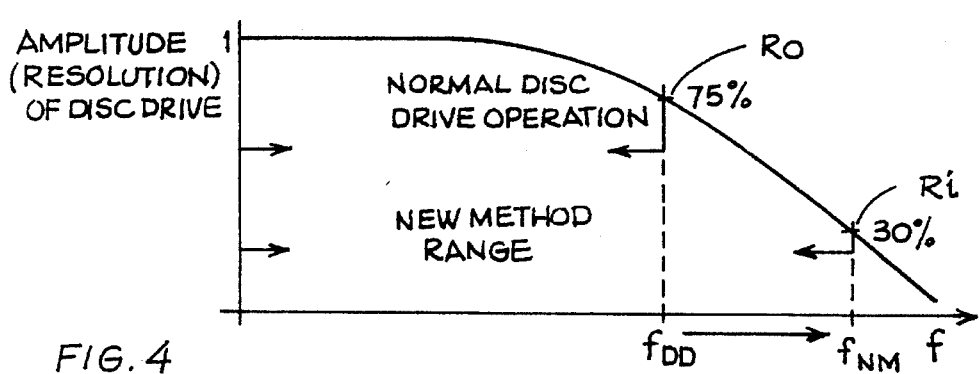
FIG. 4 is a graphical representation of amplitude resolution factor improvements achievable with use of the encoding/decoding scheme in accordance with the present invention.

FIG. 4 shows a graphical representation of amplitude resolution improvement factor between prior art and the present invention's encoding and decoding schemes. The amplitude resolution factor is another measure of data transmission parameters which relates to data throughput and concerns the ratio between the amplitudes of the data signal's highest frequency component and the lowest frequency component. Presently known decoding systems have amplitude resolution factors that are above 60% on a normalized data signal amplitude versus frequency curve. The 60% resolution factor is viewed as a data compaction limitation, i.e. the higher the resolution factor, the lower the rate of data transmission. This data compaction limitation of presently known systems being a phenomena related to management of intersymbol interference and flux reversals on the recording medium that impact accurate data bit transition detection. Thus, in a disc drive encoding and decoding scheme sensitive to the intersymbol interference due to the use of peak detector/phase-lock loop circuitry in the decoder, the amplitude resolution factor Ro would be quite high at a frequency $f_{DD}$, and typically well above 60%, typically 75% as shown. In contrast, using a PPM encoding/decoding, in conjunction with the PLL delay control in accordance with the present invention, the amplitude resolution factor Ri at frequency $f_{NM}$ can be as low as 30% due to the ability to encode and decode highly compacted data bits without concern for intersymbol interference. Hence, signals having a lower amplitude and higher frequencies can be processed, resulting in a lower amplitude resolution factor.

Therefore, while the present invention has been shown and described herein in what is believed to be the most practical and preferred embodiment, it is recognized that departures can be made therefrom within the scope of the invention, which scope is therefore not to be limited to the details disclosed herein but is to be accorded the full scope of the claims so as to embrace any and all equivalent apparatus.

I claim:

1. A data processing system apparatus, said apparatus comprising:

an encoded circuit member for encoding binary data in a pulse position modulation (PPM) format;

a plurality of delay elements associated with said encode circuit member; and a delay calibration circuit associated with said encode circuit member for calibrating said plurality of delay elements to encode said binary data in an enhanced PPM encoded format, said enhanced PPM encoded format comprises binary data bits being encoded such that each occurrence of a first binary state comprises a first time period and each occurrence of a second binary state comprises a second slightly greater time period.

2. A data processing system apparatus as described in claim 1, wherein:

said delay calibration circuit comprising a phase-lock loop (PLL) and precision crystal oscillator circuit combination that provides a reference delay for calibrating said delay elements.

3. A data processing system apparatus, said apparatus comprising:

an encode circuit member for encoding binary data in a pulse position modulation (PPM) format;

a plurality of delay elements associated with said encode circuit member; and a delay calibration circuit associated with said encode circuit member for calibrating said plurality of delay elements to encode said binary data in an enhanced PPM encoded format, said delay calibration circuit comprising a phase-lock loop (PLL) and precision crystal oscillator circuit combination that provides a reference delay for calibrating said delay elements, said enhanced PPM encoded format comprises binary data bits encoded such that each occurrence of a first binary state comprises a first time period and each occurrence of a second binary state comprises a second slightly greater time period, said first and second time periods being controlled by said delay calibration circuit, said second slightly greater time period being in the range of 10% to 30% greater than said first time period and said first and second time periods being measured in nanoseconds.

4. A data processing system apparatus as described in claim 3, said apparatus further comprising:

a decode circuit member for decoding binary data previously encoded in a pulse position modulation (PPM) format;

a plurality of delay elements associated with said decode circuit member; and a delay calibration circuit associated with said decode circuit member for calibrating said plurality of delay elements associated with said decode circuit member to delay said previously encoded binary data to assures placing a data bit into its proper decode value.

5. A data processing system apparatus as described in claim 1, wherein:

said first and second time periods being controlled by said delay calibration circuit, said second slightly greater time period being in the range of 10% to 30% greater than said first time period and said first and second time periods being measured in nanoseconds.

6. A data processing system apparatus as described in claim 1, said apparatus further comprising:

a decode circuit member for decoding binary data previously encoded in said enhanced pulse position modulation (PPM) encoded format;

a plurality of delay elements associated with said decode circuit member; and a delay calibration circuit associated with said decode circuit member for calibrating said plurality of delay elements associated with said decode circuit member to delay said previously encoded binary data to assures placement of an encoded data bit into its proper decode value.

7. A data processing system apparatus as described in claim 6, wherein:

said delay calibration circuit associated with said encode circuit member comprises a first phase-lock loop (PLL) and precision crystal oscillator circuit combination that provides a reference delay for calibrating said plurality of delay elements associated with said encode circuit member, and said delay calibration circuit associated with said decode circuit member comprises a second phase-lock loop (PLL) and precision crystal oscillator circuit combination that provides a reference delay for calibrating said plurality of delay elements associated with said decode circuit member.

8. A data processing system apparatus as described in claim 1, wherein:

said data processing system comprises disk drives in a local area network;

said delay calibration circuit facilitates 98% data throughput; and said encoded binary data comprises data encoded in at least 200 mega bits per second (MBPS) data rate.

9. A data processing system apparatus as described in claim 4, wherein:

said data processing system comprises disk drives in a local area network;

said delay calibration circuit associated with said encode circuit member facilitates 98% data throughput; and said encoded binary data comprises data encoded in at least 200 mega bits per second (MBPS) data rate.

10. A data compression circuit apparatus, said apparatus comprising:

an encode circuit member for encoding binary data in a pulse position modulation (PPM) format;

a plurality of delay elements associated with said encode circuit member; and a delay calibration circuit, said delay calibration circuit comprising a phase-lock loop (PLL) and precision crystal oscillator circuit combination that provides a reference delay for calibration said plurality of delay elements to facilitate encoding said binary data in an enhanced PPM encoded format, said enhanced PPM encoded format comprises binary data bits being encoded such that each occurrence of a first binary state comprises a first time period and each occurrence of a second binary state comprises a second slightly greater time period.

11. A data compression circuit apparatus, said apparatus comprising:

an encode circuit member for encoding binary data in a pulse position modulation (PPM) format;

a plurality of delay elements associated with said encode circuit member; and a delay calibration circuit, said delay calibration circuit comprising a phase-lock loop (PLL) and precision crystal oscillator circuit combination that provides a reference delay for calibrating said plurality of delay elements to facilitate encoding said binary data in an enhanced PPM encoded format, said delay calibration circuit facilitates 98% data throughput, and said enhanced PPM encoded format comprises binary data bits encoded such that each occurrence of a first binary state comprises a first time period and each occurrence of a second binary state comprises a second slightly greater time period, said first and second time periods being controlled by said delay calibration circuit, said second slightly greater time period being in the range of 10% to 30% greater than said first time period and said first and second time periods being measured in nanoseconds.

12. A data compression circuit apparatus as described in claim 10, wherein:

said encoded binary data comprises data encoded in at least 200 mega bits per second (MBPS) data rate.

13. A method of reducing data recovery amplitude resolution factor in encoded data signals, said method comprising the steps of:

(a) providing a delay element calibration circuit for use in an encoder to facilitate encoding data in an enhanced PPM encoded format;

(b) encoding data in PPM signal format such that each occurrence of a first data state comprises a first time period and each occurrence of a second data state comprises a second slightly greater time period than said first time period, said first and second time periods being controlled by said delay element calibration circuit, said second slightly greater time period being in the range of 10% to 30% greater than said first time period; and (c) decoding said encoded PPM data signal, said decoded signal having an amplitude resolution factor of less than 60%.

14. A decoding circuit apparatus, said apparatus comprising:

a decode circuit member for decoding binary data previously encoded in pulse position modulation (PPM) encoded format;

a plurality of delay elements associated with said decode circuit member; and a delay calibration circuit, said delay calibration circuit comprising a phase-lock loop (PLL) and precision crystal oscillator circuit combination that provides a reference delay for calibrating said plurality of delay elements to facilitate delaying said previously encoded binary data by a time period that assures placement of an encoded data bit into its proper decode value.

15. A data processing system apparatus as described in claim 4, wherein:

said delay calibration circuit associated with said decode circuit member comprises a second phase-lock loop (PLL) and precision crystal oscillator circuit combination that provides a reference delay for calibrating said plurality of delay elements associated with said decode circuit member.

16. A data compression circuit apparatus as described in claim 11, wherein:

said encoded binary data comprises data encoded in at least 200 mega bits per second (MBPS) data rate.

* * * * *